United States Patent [19]
Ishii

[11] Patent Number: 4,613,776
[45] Date of Patent: Sep. 23, 1986

[54] VOLTAGE TO CURRENT CONVERSION CIRCUIT

[75] Inventor: Satoshi Ishii, Tokyo, Japan

[73] Assignee: Pioneer Electronic Corporation, Tokyo, Japan

[21] Appl. No.: 659,930

[22] Filed: Oct. 11, 1984

[30] Foreign Application Priority Data

Oct. 14, 1983 [JP] Japan ................. 58-192251

[51] Int. Cl.$^4$ .................... G06G 7/18; H03K 7/12
[52] U.S. Cl. .................... 307/490; 307/262; 307/590; 328/26; 328/127
[58] Field of Search ........... 307/490, 590, 603, 605, 307/261, 262; 328/127, 128, 26

[56] References Cited

U.S. PATENT DOCUMENTS

| | | |
|---|---|---|
| 2,927,259 | 3/1960 | Neal .................... 307/591 |
| 3,715,487 | 2/1973 | Blake .................... 328/127 |
| 4,495,428 | 1/1985 | Ishigaki .................... 307/490 |

OTHER PUBLICATIONS

"Electronics Circuits Manual", John Markus, McGraw-Hill Book Co., New York, 1971, p. 511.
Linear and Interface Integrated Circuits, Motorola Inc., Series D, 1983, pp. 3-204, 214, 215.

*Primary Examiner*—Stanley D. Miller
*Assistant Examiner*—B. P. Davis
*Attorney, Agent, or Firm*—Sughrue, Mion, Zinn, Macpeak & Seas

[57] ABSTRACT

A current conversion circuit employing negative feedback includes an operational amplifier, a diode and a time constant circuit cascade connected, a transistor having a base connected to the output of the time constant circuit, and an impedance element connected between the inverting input terminal of the operational amplifier and the emitter of the transistor to obtain conversion current from the collector of the transistor. With this arrangement, the inventive circuit can perform the same functions as a conventional current conversion circuit but has a simpler construction and smaller number of components.

5 Claims, 9 Drawing Figures

FIG. 1
PRIOR ART
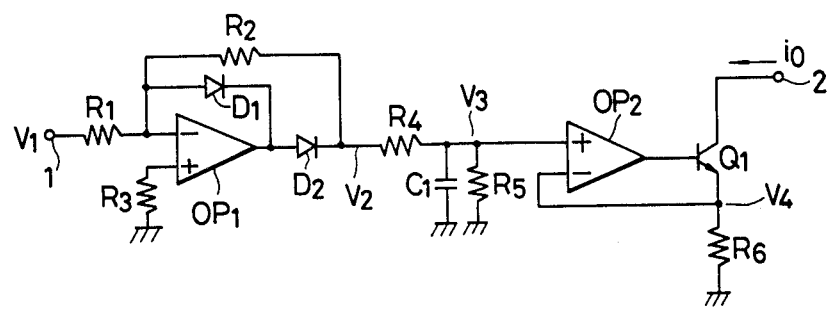
FIG. 2A
PRIOR ART
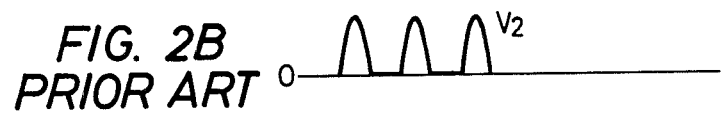
FIG. 2B
PRIOR ART
FIG. 2C
PRIOR ART
FIG. 2D
PRIOR ART

VOLTAGE TO CURRENT CONVERSION CIRCUIT

BACKGROUND OF THE INVENTION

The present invention relates to current conversion circuits, and more particularly to a current conversion circuit for converting an output voltage of a rectifier circuit into a proportional current.

A conventional device of this type is shown in FIG. 1. An input signal is applied to an input terminal 1. An operational amplifier OP1, resistors $R_1$, $R_2$ and $R_3$, and diodes $D_1$ and $D_2$ form a conventional half-wave rectifier circuit. The junction point of the resistor $R_2$ and the cathode of the diode $D_2$ is connected to one terminal of a resistor $R_4$, the other terminal of which is connected to the noninverting input terminal of an operational amplifier OP2, one terminal of a resistor $R_5$ and one terminal of a capacitor $C_1$. The other terminals of the resistor $R_5$ and the capacitor $C_1$ are grounded.

The output terminal of the operational amplifier OP2 is connected to the base of a transistor $Q_1$, the emitter of which is connected to the inverting input terminal of the operational amplifier OP2 and one terminal of a resistor $R_6$, the other terminal of which is grounded. The operational amplifier OP2, the transistor $Q_1$ and the resistor $R_6$ form a so-called current conversion circuit.

The operation of the device will be described with reference to FIGS. 2A to 2D which illustrate signal waveforms at various circuit points in the device. When an input $v_1$ as shown in FIG. 2A is applied to the input terminal 1, a waveform $v_2$ as shown in FIG. 2B, which is obtained by subjecting the input $v_1$ to inversion amplification and to half-wave rectification, is provided at the cathode of the diode $D_2$. Accordingly, at the junction point of the resistors $R_4$ and $R_5$, the capacitor $C_1$ and the noninverting input terminal of the OP2, a signal $v_3$ having a waveform as shown in FIG. 2C is obtained by a time constant circuit composed of the resistors $R_4$ and $R_5$. In this case, the resistance of the resistor $R_4$ is much smaller than that of the resistor $R_5$ ($R_4 << R_5$).

The operational amplifier OP2 and the transistor $Q_1$ form a voltage follower. Therefore, the waveform of the emitter output $v_4$ of the transistor $Q_1$ is similar to that of the signal $v_3$. Accordingly, if the base current of the transistor $Q_1$ is disregarded, then the waveform of the collector current (i.e., the output current $i_0$) as shown in FIG. 2D is similar to that shown in FIG. 2C. This output current is used as a control current for gain control, for instance.

The conventional current conversion circuit, designed as described above, suffers from drawbacks in that it is intricate and needs a number of components, and accordingly it is high in manufacturing cost.

SUMMARY OF THE INVENTION

Accordingly, an object of the invention is to eliminate the above-described difficulties accompanying a conventional current conversion circuit.

More specifically, an object of the invention is to provide a current conversion circuit which is simple in arrangement and requires only a small number of components when compared with a conventional circuit, but can perform the same function.

In accordance with the above and other objects, the invention provides a current conversion circuit including a single operational amplifier, a diode and a time constant circuit cascade connected. The base of a transistor is connected to the output terminal of the time constant circuit, and an impedance element is connected between the inverting input terminal of the operational amplifier and the emitter of the transistor. A conversion current is obtained at the collector of the transistor.

The foregoing object and other objects of the invention as well as the characteristic features of the invention will become more apparent from the following detailed description when read in conjunction with the accompanying drawings.

BRIEF DESCRIPTION OF THE DRAWINGS

In the accompanying drawings:

FIG. 1 is a circuit diagram showing an example of a conventional current conversion circuit;

FIGS. 2A, 2B, 2C and 2D are waveform diagrams for a description of the operation of the circuit in FIG. 1;

DESCRIPTION OF THE PREFERRED EMBODIMENTS

Figure 3:
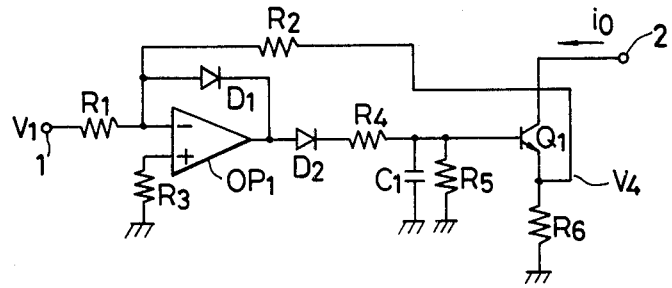
FIG. 3 is a circuit diagram showing an example of a current conversion circuit according to the invention.

A first example of a current conversion circuit according to the invention is shown in FIG. 3 in which those components which have been previously described with reference to FIG. 1 are therefore designated by the same reference numerals and characters.

The circuit shown in FIG. 3 differs from that shown in FIG. 1 only in that the operational amplifier OP2 is eliminated, the junction point of the resistors $R_4$ and $R_5$ forming the time constant circuit is connected to the base of the transistor $Q_1$, and the transistor $R_2$ is connected between the inverting input terminal of the operational amplifier OP1 and the emitter of the transistor $Q_1$.

The circuit operates as follows:

When the input signal $v_1$ is negative, the diode $D_1$ is conductive. Negative feedback is then applied to the operational amplifier OP1 by means of the resistor $R_2$. Therefore:

$$v_4 = -v_1 \times R_2/R_1.$$

However, since the discharge time constant is large, when the absolute value of the input signal $v_1$ is decreased after the capacitor $C_1$ has been charged, the negative feedback is eliminated, and voltage variations according to the discharge curve occur at the emitter output $v_4$ of the transistor $Q_1$.

On the other hand, when the input $v_1$ is positive, the output of the operational amplifier OP1 is in a range of 0 to $-7V$ (the negative value of the forward voltage component of the diode $D_1$) and the diode $D_2$ is rendered conductive so that a voltage corresponding to the charge of the capacitor appears as the output $v_4$. Accordingly, in this case also, the waveform of the output $v_4$ is similar to that shown in FIG. 2, and the waveform of the output current $i_0$ is also substantially similar thereto.

If the emitter resistor $R_6$ is eliminated, the current flowing through the resistor $R_2$ becomes the output current $i_0$ directly. Therefore, if this is utilized, then the resistor $R_6$ can be eliminated from the circuit.

Figure 4:
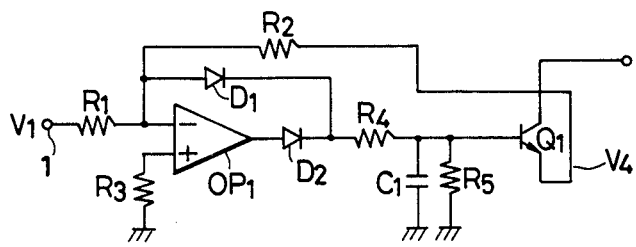
FIGS. 4, 5 and 6 are circuit diagrams showing other examples of current conversion circuits according to the invention.
Figure 5:
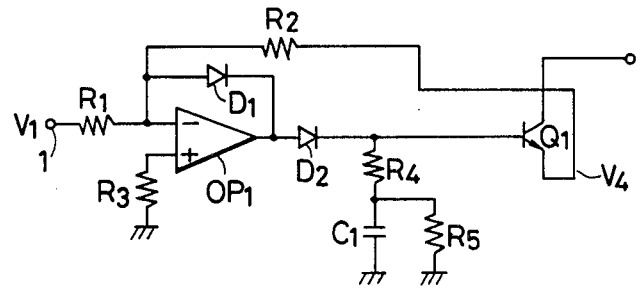

The circuit shown in FIG. 3 may be modified so that the cathode of the diode $D_1$ is connected to the cathode of the diode $D_2$, as shown in FIG. 4. Furthermore, the circuit may be modified so that, as shown in FIG. 5, the resistor $R_4$ and a parallel circuit composed of the capacitor $C_1$ and the resistor $R_5$ are connected as a time constant circuit between the cathode of the diode $D_2$ and ground.

Figure 6:
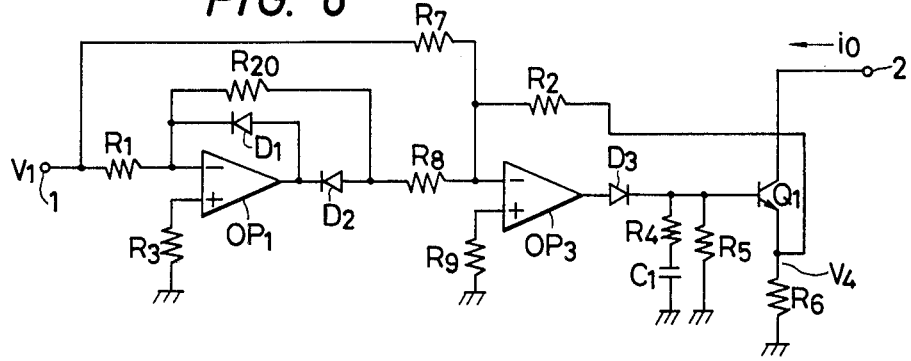

Furthermore, the technical concept of the invention may be applied to a full-wave rectifier circuit as shown in FIG. 6. In FIG. 6, an operational amplifier OP1, diodes $D_1$ and $D_2$, and resistors $R_1$, $R_{20}$ and $R_3$ form a negative voltage half-wave rectifier circuit. The recitified output of the negative voltage half-wave rectifier circuit is applied through a resistor $R_8$ to the inverting input terminal of an operational amplifier OP3.

On the other hand, an input signal $v_1$ is applied through a resistor $R_7$ to the inverting input terminal of the operational amplifier OP3 so that the two signals are added together. If, in this connection, the resistance of the resistors $R_1$, $R_{20}$, $R_7$ and $R_8$ are determined so as to meet the following equations:

$$R_1 = R_{20} = R_8 = R, \text{ and}$$

$$R_7 = 2R,$$

then, as for the input levels to the operational amplifier OP3, the ratio of the half-wave rectification component applied through the resistor $R_8$ to the input signal component applied through the resistor $R_7$ is 2:1, and correct full-wave rectification of the input signal can be obtained. The output of the operational amplifier OP3 is applied through a diode $D_3$ and a time constant circuit composed of resistors $R_4$ and $R_5$ and a capacitor $C_1$ to the base of a transistor $Q_1$ so that negative feedback is applied to the inverting input terminal of the operational amplifier OP3 from the emitter of the transistor.

The time constant circuit may be modified or changed in various manners. Furthermore, the technical concept of the invention can be applied not only to the above-described rectifier circuit but also to various other circuits. Instead of a bipolar transistor Q, an FET may be employed, or a bipolar transistor of the opposite polarity type can be used. In addition, the feedback resistor $R_2$ may be replaced by a nonlinear element.

As is apparent from the above description, the current conversion circuit of the invention is simple in arrangement and requires only a small number of components when compared with the conventional circuit, and yet it can perform the same function.

I claim:

1. A current conversion circuit comprising:
   an operational amplifier, a diode and a time constant circuit cascade connected, an input signal being applied to an inverting input terminal of said operational amplifier;
   a transistor the base of which is connected to the output terminal of said time constant circuit and the collector of which is connected to an output terminal; and
   an impedance element connected between said inverting input terminal of said operational amplifier and the emitter of said transistor,
   a conversion current being obtained at said output terminal.

2. The current conversion circuit of claim 1, wherein said time constant circuit comprises a first resistor connected in series with said diode, and a parallel combination of a second resistor and a capacitor coupled between one terminal of said first resistor and ground.

3. The current conversion circuit of claim 2, further comprising a third resistor coupled between said emitter of said transistor and ground.

4. The current conversion circuit of claim 1, wherein said time constant circuit comprises first and second resistors connected in series between one terminal of said diode and ground, and a capacitor coupled between a junction point of said first and second resistors and ground.

5. The current conversion circuit of claim 1, further comprising a second operational amplifier having an output coupled through a second diode and first resistor to said inverting input terminal of said first-mentioned operational amplifier; a second resistor coupled between a junction point of said second diode and said first resistor and an inverting input terminal of said second operational amplifier; a third resistor coupled between said inverting input terminal of said second operational amplifier and a voltage input terminal; and a fourth resistor coupled between said inverting input terminal of said first-mentioned operational amplifier and said voltage input terminal, wherein resistances of said first, second and third resistors are equal, and a resistance of said fourth resistor is substantially equal to twice the resistance of any one of said first, second and third resistors.

* * * * *